United States Patent
Kim et al.

(10) Patent No.: US 7,652,707 B2
(45) Date of Patent: Jan. 26, 2010

(54) PIXEL CIRCUIT WITH REDUCED WIRING

(75) Inventors: Young-Chan Kim, Seongnam-si (KR); Tetsuo Asaba, Suwon-si (KR); Yi-Tae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 582 days.

(21) Appl. No.: 11/449,326

(22) Filed: Jun. 8, 2006

(65) Prior Publication Data

US 2006/0278811 A1 Dec. 14, 2006

(30) Foreign Application Priority Data

Jun. 8, 2005 (KR) ...................... 10-2005-0048824

(51) Int. Cl.
*H04N 3/14* (2006.01)
*H04N 5/335* (2006.01)
*H01L 27/00* (2006.01)
(52) U.S. Cl. .................. 348/308; 348/294; 348/302; 250/208.1
(58) Field of Classification Search ......... 348/294–310, 348/245; 250/208.1
See application file for complete search history.

(56) References Cited

U.S. PATENT DOCUMENTS

| 6,466,266 | B1 | 10/2002 | Guidash et al. ............. 348/308 |
| 6,710,803 | B1 | 3/2004 | Kang ......................... 348/245 |
| 7,324,144 | B1 * | 1/2008 | Koizumi ..................... 348/294 |
| 7,391,453 | B2 * | 6/2008 | Ohkawa ..................... 348/302 |
| 2004/0141077 | A1 * | 7/2004 | Ohkawa ..................... 348/308 |
| 2005/0237405 | A1 * | 10/2005 | Ohkawa ..................... 348/308 |
| 2006/0256221 | A1 * | 11/2006 | Mckee et al. ................ 348/308 |

OTHER PUBLICATIONS

Korean Patent Application No. 1020030027767 to Lee, having Publication date of Nov. 9, 2004 (w/English Abstract page).
Korean Patent Application No. 1020030027884 to Lee, having Publication date of Nov. 9, 2004 (w/English Abstract page).

* cited by examiner

*Primary Examiner*—Jason Chan
*Assistant Examiner*—Pritham Prabhakher
(74) *Attorney, Agent, or Firm*—Monica H. Choi

(57) ABSTRACT

A pixel circuit of an image sensor includes a floating diffusion node and a reset transistor. The reset transistor is coupled between the floating diffusion node and a reset control signal node of another pixel circuit of the image sensor. A voltage applied on the reset control signal node of the other pixel circuit is a reset voltage transmitted to the floating diffusion node via the reset transistor.

22 Claims, 4 Drawing Sheets

US 7,652,707 B2

PIXEL CIRCUIT WITH REDUCED WIRING

This application claims priority to Korean Patent Application No. 2005-48824, filed on Jun. 8, 2005 in the Korean Intellectual Property Office, the disclosure of which is incorporated herein in its entirety by reference.

BACKGROUND OF THE INVENTION

1. Field of the Invention

The present invention relates generally to image sensors, and more particularly, to a pixel circuit coupled to a reset control signal node of another pixel circuit for receiving a reset voltage and/or a power supply voltage, to reduce wiring in an image sensor.

2. Description of the Related Art

CMOS (complementary metal oxide semiconductor) image sensors are commonly included in many electronic devices such as mobile phones and digital still cameras. A CMOS image sensor senses an image, converts the image into electrical signals that are in turn converted into digital image signals. The digital image signals output from the CMOS image sensor are typically for three-colors (red, green, and blue). After being processed, the digital image signals drive a display device such as a liquid crystal display (LCD).

FIG. 1 shows a block diagram of a conventional CMOS image sensor 100. Referring to FIG. 1, the image sensor 100 includes an APS (active pixel sensor) array 110, a row driver 120, and an ADC (analog-to-digital converter) 130.

The row driver 120 receives a control signal from a row decoder (not shown), and the ADC 130 receives a control signal from a column decoder (not shown). The image sensor 100 also includes a controller (not shown) that generates timing control signals as well as addressing signals used for detecting and outputting a respective image signal for each pixel.

FIG. 2 illustrates an example color filter pattern of the APS array 110 of FIG. 1. The CMOS image sensor 100 that is a color image sensor includes a respective color filter in an upper part of each pixel to receive and detect light of a certain color. The CMOS image sensor 100 includes at least three types of color filters to form a color signal. The most common color filter pattern is a Bayer pattern as illustrated in FIG. 2.

In FIG. 2, a pixel with a "G" designation has a color filter for the green color, a pixel with an "R" designation has a color filter for the red color, and a pixel with a "B" designation has a color filter for the blue color. In such a Bayer pattern, green, which is closely related to a luminance signal, is placed in all rows, and red and blue are placed in alternate rows to enhance luminance resolution. For enhanced resolution, a CMOS image sensor typically includes more than one million pixels for implementing common electronic devices such as a digital still camera.

The APS array 110 includes photodiodes which convert received light of such colors into electrical signals to generate image signals. The analog image signals output from the APS array 110 are three-color (red, green, and blue) analog image signals. The ADC 130 receives the analog image signals and converts the analog image signals into digital signals using a well-known correlated double sampling (CDS) method.

FIG. 3 shows a circuit diagram of a unit pixel circuit 300 included in the APS array 110 of FIG. 1 for a respective pixel. Referring to FIG. 3, the unit pixel circuit 300 includes a photodiode PD and four transistors. In analog to digital conversion using the CDS method, a reset signal VRES and an image signal VSIG are output from the pixel circuit 300 for each pixel.

To this end, referring to FIG. 3, a row for the pixel is selected by activation of a row select signal SEL. For output of the reset signal VRES, a reset control signal RX turns on a reset transistor to couple a power supply voltage VDD to a floating diffusion (FD) node. Such power supply voltage VDD coupled to the FD node forms the reset signal VRES output through a source follower transistor and a row select transistor.

For output of the image signal VSIG, the photodiode PD converts received light into an electrical signal that is transferred to the FD node via a transfer transistor upon activation of a transfer control signal TX. Such electrical signal at the FD node is output as the image signal VSIG through the source follower transistor and the row select transistor.

For correlated double sampling, the difference between the reset signal VRES and the image signal VSIG, which is an analog signal, is converted into a digital signal by the ADC 120. The row select signal SEL, the reset control signal RX, and the transfer control signal TX may be generated by the row driver 120 in FIG. 1.

As illustrated in FIG. 3, the unit pixel circuit 300 in the CMOS image sensor 100 includes the photodiode PD and the transistors for outputting the reset signal VRES and the image signal VSIG with appropriate timing.

Recently, the number of pixels desired in an image sensor has increased such that smaller size pixels are in turn desired. Therefore, metal wiring for connecting the photodiode PD and the transistors in the unit pixel circuit 300 is desired to be reduced for securing sufficient space for the photodiode PD.

To this end, the number of transistors used in a unit pixel circuit may be reduced as disclosed in U.S. Pat. No. 6,710,803 to Kang for example. Alternatively, size of the transistors in the unit pixel circuit 300 may be reduced using advanced fabrication technology. However, there is a limit to reducing the number of transistors required in the unit pixel circuit 300, and advanced fabrication technology is expensive.

To ensure that external light reaches the photodiode PD, metal wiring in an upper layer of the photodiode PD, which may be a major obstruction for such light, may be minimized. However, there is a limit to reducing the widths of metal wires when complying with design rules in integrated circuit fabrication.

SUMMARY OF THE INVENTION

Accordingly, embodiments of the present invention reduce metal wiring to a pixel circuit by coupling a voltage at a reset control signal node of another pixel circuit as a reset voltage and/or a power supply voltage.

According to an aspect of the present invention, a pixel circuit of an image sensor includes a floating diffusion node and a reset transistor. The reset transistor is coupled between the floating diffusion node and a reset control signal node of another pixel circuit of the image sensor. A voltage applied on the reset control signal node of the other pixel circuit is a reset voltage transmitted to the floating diffusion node via the reset transistor.

In one embodiment of the present invention, the reset transistor is a field effect transistor having drain/source electrodes coupled between the floating diffusion node and the reset control signal node of the other pixel circuit.

In an example embodiment of the present invention, the reset control signal node is for a neighboring pixel circuit disposed along a same column.

In a further embodiment of the present invention, the pixel circuit also includes a source follower transistor coupled to the floating diffusion node and the reset control signal node of the other pixel circuit. In that case, the voltage applied on the reset control signal node of the other pixel circuit is a power supply voltage for the source follower transistor.

In another embodiment of the present invention, the pixel circuit also includes a row select transistor coupled to the source follower transistor. In that case, the source follower transistor transmits the reset voltage at the floating diffusion node to the row select transistor that in turn outputs a reset signal.

In a further embodiment of the present invention, the pixel circuit includes a transfer transistor coupled to the floating diffusion node and includes a photodiode coupled to the transfer transistor. The photodiode converts received light into an electrical signal, and the transfer transistor transmits the electrical signal from the photo-diode to the floating diffusion node after the reset voltage has been read out from the floating diffusion node.

In this manner, separate metal wiring is not used for coupling the reset voltage to the floating diffusion node and for coupling the power supply voltage to the source follower transistor. Thus, metal wiring is minimized for ensuring fill factor of the photo-diode.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, and 5 refer to elements having similar structure and/or function.

DETAILED DESCRIPTION OF THE INVENTION

Figure 1:
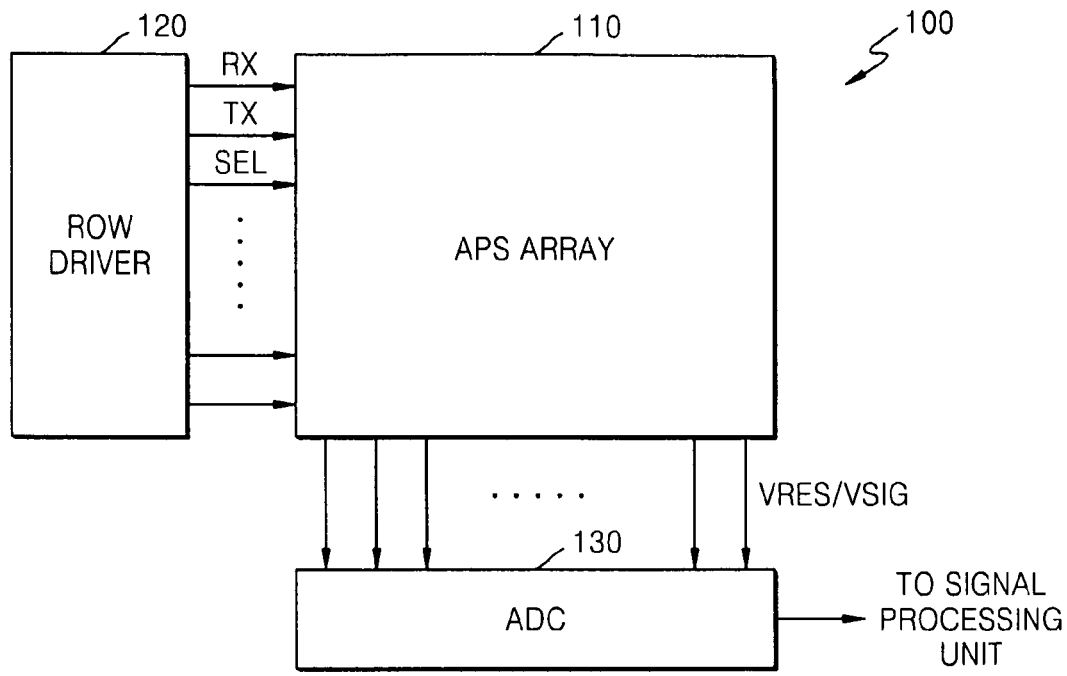
FIG. 1 is a block diagram of a conventional CMOS image sensor.
Figure 2:
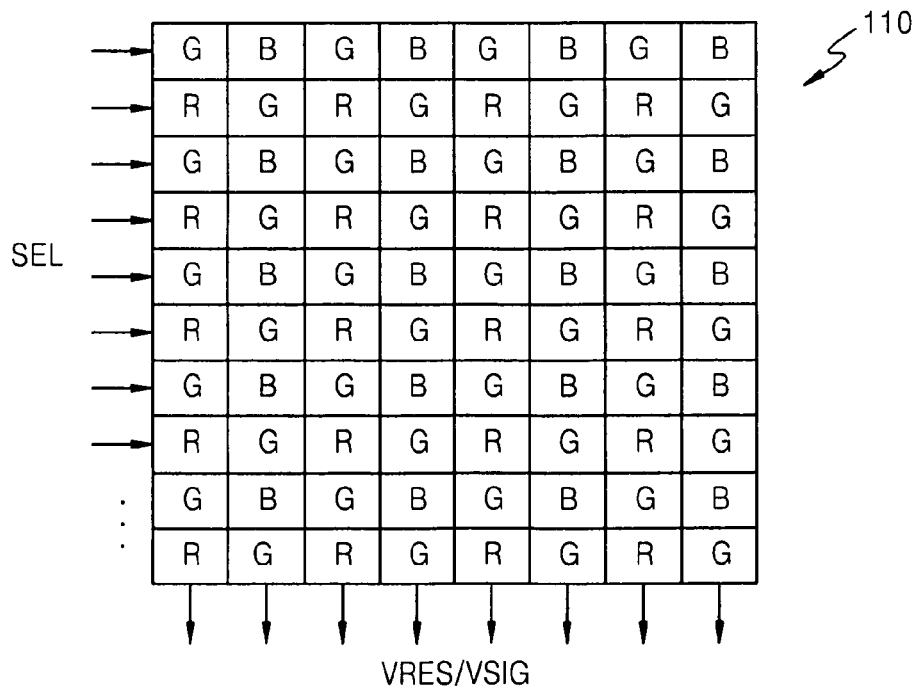
FIG. 2 illustrates an example color filter pattern of an active pixel sensor (APS) array of FIG. 1, as known in the prior art.
Figure 3:
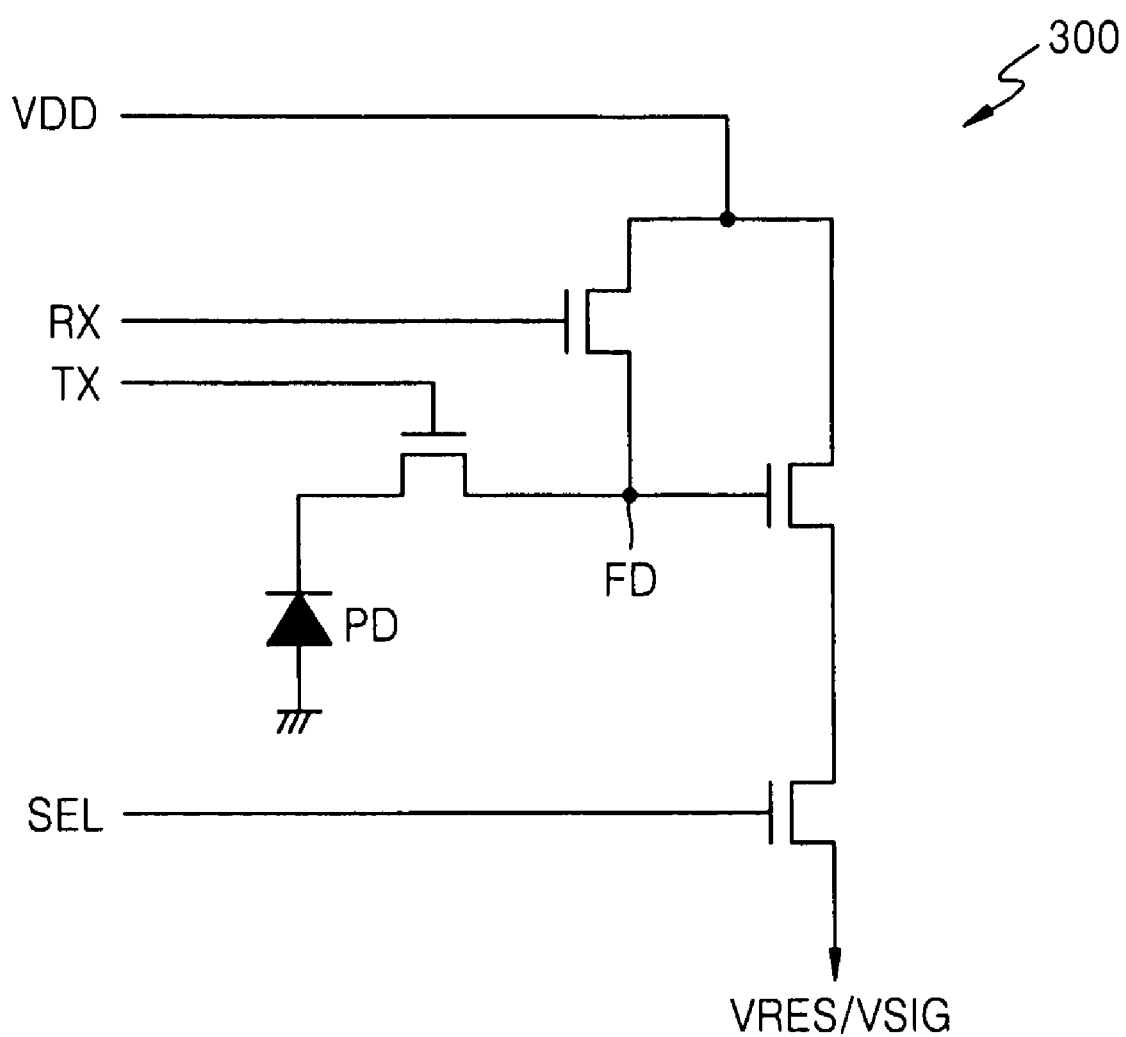
FIG. 3 is a circuit diagram of a unit pixel circuit included in the APS array of FIG. 1, according to the prior art.
Figure 4:
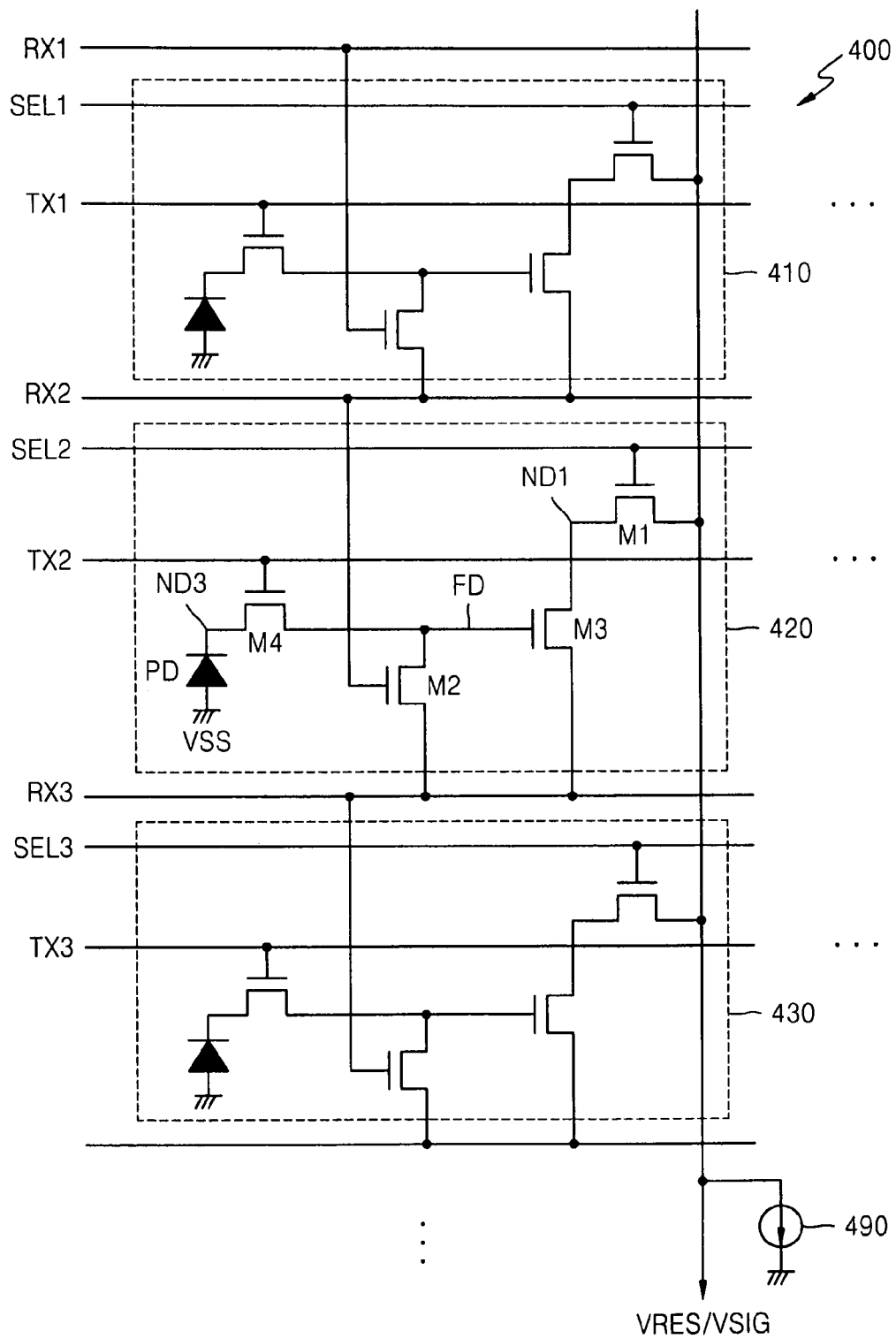
FIG. 4 is a circuit diagram of pixel circuits included a CMOS image sensor, with reduced wiring according to an embodiment of the present invention.

FIG. 4 shows an array of pixel circuits 400 included in a CMOS (complementary metal oxide semiconductor) image sensor according to an embodiment of the present invention. FIG. 4 shows three unit pixel circuits 410, 420, and 430 disposed along a same column in the array 400, for simplicity and clarity of illustration. However, the array 400 includes pixel circuits arranged two-dimensionally along more numerous rows and columns for forming an active pixel sensor (APS) array of the CMOS image sensor.

The column of pixel circuits 410, 420, and 430 is coupled to a same output node biased with a bias circuit 490. The bias circuit 490 may be disposed vertically above or below the APS array. The CMOS image sensor of FIG. 4 may include a row driver and an analog-to-digital converter (ADC). The row driver (not shown) may generate row select signals SEL1, SEL2, SEL3, . . . , reset control signals RX1, RX2, RX3, . . . , and transfer control signals TX1, TX2, TX3, . . . for driving the pixel circuits of FIG. 4. The ADC (not shown) may receive a reset signal VRES and an image signal VSIG from the output node of FIG. 4 for conversion of such analog signals into digital signals.

Components of an example unit pixel circuit 420 are now described. However, each of the pixel circuits of the array 400 is comprised of similar such respective components. The unit pixel circuit 420 includes a row select transistor M1, a reset transistor M2, a source follower transistor M3, a transfer transistor M4, and a photodiode PD. All of the transistors illustrated in FIG. 4 are NMOSFETs (N-channel metal oxide semiconductor field effect transistors). However, the present invention may be practiced with other types of transistors.

The row select signal SEL2 is applied on a gate electrode of the row select transistor M1. A first source/drain electrode of M1 is coupled to a first node ND1, and a second source/drain electrode of M1 is coupled to the output node. The reset control signal RX2 is applied on a gate electrode of the reset transistor M2. A first source/drain electrode of M2 is coupled to a reset control signal node of another pixel circuit 430, and a second source/drain electrode of M2 is coupled to a FD (floating diffusion) node. In one embodiment of the present invention, the other pixel circuit 430 is a neighboring pixel circuit along a same column as the pixel circuit 420.

A gate electrode of the source follower transistor M3 is coupled to the FD node. A first source/drain electrode of M3 is coupled to the reset control signal node of the other pixel circuit 430, and a second source/drain electrode of M3 is coupled to the first node ND1. A transfer control signal TX2 is applied on a gate electrode of the transfer transistor M4. A first source/drain electrode of M4 is coupled to the FD node, and a second source/drain electrode of M4 is coupled to a third node ND3.

The photodiode PD performs photoelectric conversion between a power source VSS (for example, a ground voltage source) and the third node ND3. The photodiode PD converts received light into an electrical signal formed at the third node ND3.

Figure 5:
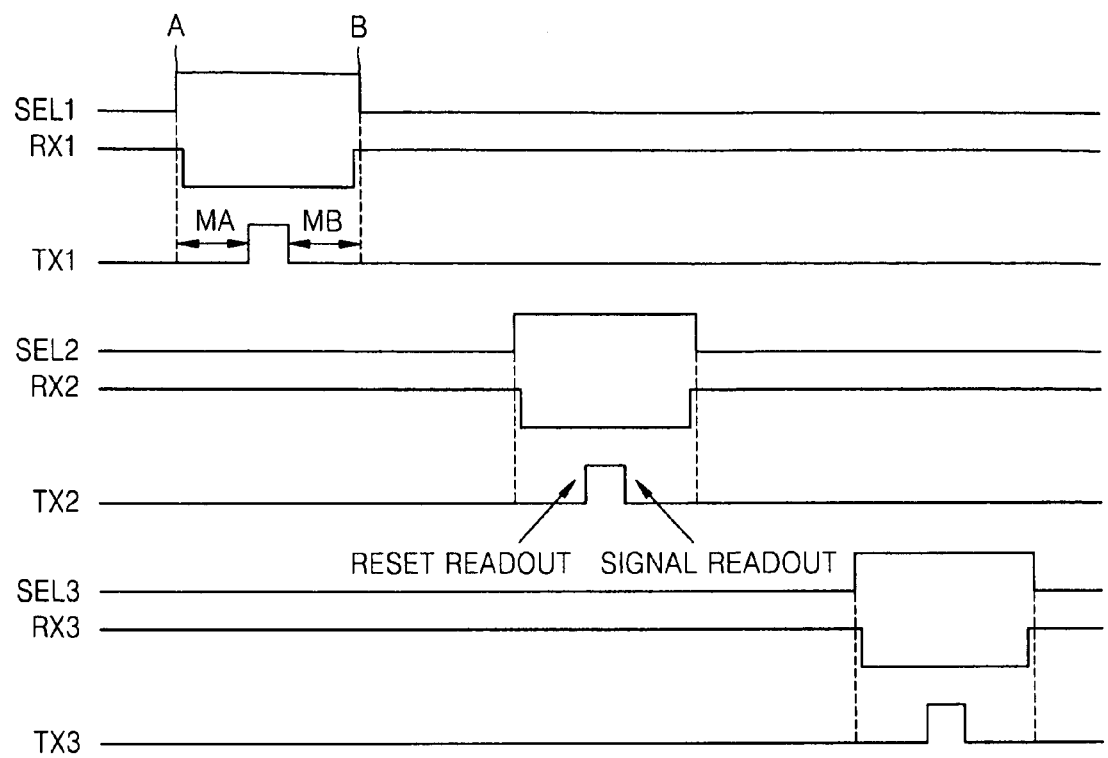
FIG. 5 is a timing diagram of signals driving the pixel circuits of FIG. 4, according to an embodiment of the present invention.

FIG. 5 shows a timing diagram of signals for driving the pixel circuits 410, 420, and 430 of FIG. 4 according to an embodiment of the present invention. Referring to FIG. 5, the unit pixel circuit 410 operates in response to the row select signal SEL1, the reset control signal RX1, and the transfer control signal TX1. The unit pixel circuit 420 operates in response to the row select signal SEL2, the reset control signal RX2, and the transfer control signal TX2. The unit pixel circuit 430 operates in response to the row select signal SEL3, the reset control signal RX3, and the transfer control signal TX3.

Referring to FIG. 5, each of the row select signals SEL1, SEL2, and SEL3 is in turn activated to the logic high state every vertical scan cycle to select one row. Each of the reset control signals RX1, RX2, and RX3 is activated to the logic low state for a predetermined time period while a respective one of the row select signals SEL1, SEL2, and SEL3 is at the logic high state, as illustrated in FIG. 5.

Each of the transfer control signals TX1, TX2, and TX3 is activated to the logic high state for a predetermined time period while a respective one of the reset control signals RX1, RX2, and RX3 is at the logic low state, as illustrated in FIG. 5. Such a time period when each of the transfer control signals TX1, TX2, and TX3 is at the logic high state, has a time margin of MA from time point A when a respective one of the row select signals SEL1, SEL2, and SEL 3 is activated to the logic high state, and has a time margin MB before time point B when a respective one of the row select signals SEL1, SEL2, and SEL 3 is deactivated to the logic low state.

The operation of the pixel circuit 420 of FIG. 4 is now described with reference to FIG. 5. However, each of the pixel circuits of the array 400 of FIG. 4 would operate similarly as the pixel circuit 420.

Before the row select signal SEL2 is activated to the logic high state, the reset control signal RX2 is set to the logic high state. During such time, the reset control signal RX3 of the other pixel circuit 430 is also set at the logic high state. The voltage of such a reset control signal RX3 of the other pixel circuit 430 is a reset voltage that is transmitted to the FD node through the reset transistor M2.

The reset control signal RX3 of the other pixel circuit 430 remains at the logic high state at least for a period of time before the row select signal SEL2 is activated. Thus, the reset control signal RX3 of the other pixel circuit 430 is advantageously used as the reset voltage for resetting the FD node in a stable manner, thus reducing metal wiring for the array 400.

The present invention may also be practiced with one of the source/drain electrodes of the reset transistor M2 also being coupled to the reset control signal node of any other pixel circuit in the array 400, aside from the example pixel circuit 430. The voltage of the a reset control signal node of such another pixel circuit is desired to be activated to the logic high state for a sufficient time period before the row select signal SEL2 is activated, for resetting the FD node. The neighboring pixels 410 and 430 may be preferable for meeting such a timing margin requirement.

Further referring to FIGS. 4 and 5, the row select transistor M1 transmits an output of the source follower transistor M3 to the output node when the row select signal SEL2 is activated to the logic high state. In addition, when the reset control signal RX2 is activated to the logic low state, the source follower transistor M3 transmits the reset voltage at the FD node to the row select transistor M1. The row select transistor M1 outputs such a reset voltage at the output node as a reset signal VRES (indicated as RESET READOUT in FIG. 5).

The reset control signal RX3 of the other pixel circuit 430 is also coupled to a source/drain node of the source follower transistor M3. Thus, the reset control signal RX3 of the other pixel circuit 430 that is set to the logic high state is used as a power supply voltage to the source follower transistor M3 during such transmission of the reset voltage at the FD node, for reducing metal wiring. However, the present invention may also be practiced with the source follower transistor M3 being coupled between another power supply source aside from the reset control signal RX3 of the other pixel circuit 430.

Further referring to FIGS. 4 and 5, after the reset signal VRES is output, the transfer control signal TX2 is activated to the logic high state for a predetermined time period. During such a time period, the electrical signal generated by the photodiode PD from photoelectric conversion of received light is transmitted to the FD node through the transmit transistor M4.

Subsequently, the transfer control signal TX2 is switched to the logic low state, and the electrical signal developed at the FD node is transmitted via the source follower transistor M3 and the row select transistor M1 as an image signal VSIG (indicated as SIGNAL READOUT in FIG. 5). Other pixel circuits such as 410 and 430 operate similarly with similar activation of respective row select, reset, and transfer control signals.

The ADC (not shown) may use the correlated double sampling (CDS) method for converting an analog signal corresponding to a difference between the reset signal VRES and the image signal VSIG into a digital signal. Such a digital signal may be further processed by a digital signal processing unit (not shown) such as by interpolating the digital signal for generating driving signals appropriate for the resolution of a display device such as a LCD (liquid crystal display).

In this manner, a voltage of the reset control signal RX3 of another pixel circuit is used as the reset voltage and/or a power supply voltage for a pixel circuit. Thus, metal wiring for such a reset voltage and/or such a power supply voltage is not required for minimizing metal wiring in the APS array of the CMOS image sensor. Consequently, the size of the photodiode PD may be increased for enhanced optical efficiency. Furthermore, a signal-to-noise ratio of the image signal VSIG to the reset signal VRES may be raised, thereby improving display quality of the image.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, any number of elements, or type of devices, or timing diagrams of signals illustrated and described herein are by way of example only. The present invention is limited only as define in the following claims and equivalents thereof.

What is claimed is:

1. A pixel circuit of an image sensor, the pixel circuit comprising:
   a floating diffusion node; and
   a first reset transistor coupled between the floating diffusion node and a reset control signal node of another pixel circuit of the image sensor;
   wherein a voltage applied on the reset control signal node of said another pixel circuit is a reset voltage transmitted to the floating diffusion node via the first reset transistor,
   and wherein the reset control signal node is at a gate node of a second reset transistor of said another pixel circuit.

2. The pixel circuit of claim 1, wherein the first reset transistor is a field effect transistor having drain/source electrodes coupled between the floating diffusion node and the reset control signal node of said another pixel circuit.

3. The pixel circuit of claim 2, wherein the first reset field effect transistor becomes conductive for transmitting the reset voltage to the floating diffusion node when a reset control signal applied on a gate of the first reset field effect transistor is set to a predetermined logic state.

4. The pixel circuit of claim 1, wherein the reset voltage is for a logic high state of a reset control signal applied on the reset control signal node of said another pixel circuit.

5. The pixel circuit of claim 1, wherein the reset control signal node is for a neighboring pixel circuit that is said another pixel circuit.

6. The pixel circuit of claim 5, wherein the neighboring pixel circuit is disposed along a same column.

7. The pixel circuit of claim 1, further comprising:
   a source follower transistor coupled to the floating diffusion node and the reset control signal node of said another pixel circuit;
   wherein the voltage applied on the reset control signal node of said another pixel circuit is a power supply voltage for the source follower transistor.

8. The pixel circuit of claim 7, further comprising:
   a row select transistor coupled to the source follower transistor;
   wherein the source follower transistor transmits the reset voltage at the floating diffusion node to the row select transistor that outputs a reset signal.

9. The pixel circuit of claim 1, further comprising:
a transfer transistor coupled to the floating diffusion node; and
a photodiode coupled to the transfer transistor, the photo-diode converting received light into an electrical signal,
wherein the transfer transistor transmits the electrical signal from the photo-diode to the floating diffusion node after the reset voltage has been read out from the floating diffusion node.

10. The pixel circuit of claim 1, wherein the image sensor is a CMOS (complementary metal oxide semiconductor) image sensor.

11. The pixel circuit of claim 1, wherein said another pixel circuit is any one of a plurality of pixel circuits disposed vertically above the pixel circuit.

12. The pixel circuit of claim 1, wherein said another pixel circuit is any one of pixel circuits disposed vertically below the pixel circuit.

13. A method of driving a pixel circuit of an image sensor, comprising:
coupling a voltage applied on a reset control signal node of another pixel circuit as a reset voltage to a first reset transistor of said pixel circuit, and wherein the reset control signal node is at a gate node of a second reset transistor of said another pixel circuit; and
turning on the first reset transistor for transmitting the reset voltage from the reset control signal node of said another pixel circuit to a floating diffusion node of said pixel circuit.

14. The method of claim 13, wherein the first reset transistor is a field effect transistor having drain/source electrodes coupled between the floating diffusion node and the reset control signal node of said another pixel circuit.

15. The method of claim 14, wherein the first reset field effect transistor becomes conductive for transmitting the reset voltage to the floating diffusion node when a reset control signal applied on a gate of the first reset field effect transistor is set to a predetermined logic state.

16. The method of claim 13, wherein the reset voltage is for a logic high state of a reset control signal applied on the reset control signal node of said another pixel circuit.

17. The method of claim 13, wherein the reset control signal node is for a neighboring pixel circuit that is said another pixel circuit.

18. The method of claim 17, wherein the neighboring pixel circuit is disposed along a same column.

19. The method of claim 13, further comprising:
coupling the voltage applied on the reset control signal node of said another pixel circuit as a power supply voltage to a source follower transistor of said pixel circuit.

20. The method of claim 19, further comprising:
transmitting the reset voltage at the floating diffusion node to a row select transistor that outputs a reset signal, via the source follower transistor having the power supply voltage applied thereon.

21. The method of claim 13, further comprising:
converting received light into an electrical signal; and
transmitting the electrical signal to the floating diffusion region via a transfer transistor after the reset voltage has been read out from the floating diffusion region.

22. The method of claim 13, wherein the image sensor is a CMOS (complementary metal oxide semiconductor) image sensor.

* * * * *